(12) United States Patent
Chong et al.

(10) Patent No.: US 10,769,819 B2
(45) Date of Patent: Sep. 8, 2020

(54) FLOATING-POINT DATA COMPRESSION

(71) Applicant: QUALCOMM Incorporated, San Diego, CA (US)

(72) Inventors: In Suk Chong, San Diego, CA (US); Xianglin Wang, San Diego, CA (US); Cheng-Teh Hsieh, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 135 days.

(21) Appl. No.: 16/140,108

(22) Filed: Sep. 24, 2018

(65) Prior Publication Data

US 2020/0098138 A1 Mar. 26, 2020

(51) Int. Cl.
| | |
|---|---|
| *H03M 7/24* | (2006.01) |
| *H04N 19/182* | (2014.01) |
| *H04N 19/124* | (2014.01) |
| *G06F 7/483* | (2006.01) |
| *G06T 9/00* | (2006.01) |

(52) U.S. Cl.
CPC .............. *G06T 9/002* (2013.01); *G06F 7/483* (2013.01); *H03M 7/24* (2013.01); *H04N 19/124* (2014.11); *H04N 19/182* (2014.11)

(58) Field of Classification Search
CPC .... H04N 19/124; H04N 19/182; H04N 1/417; G06T 5/007; G06T 5/008; G06T 9/002; G06T 9/004; G06T 9/008; G06F 7/483; G06F 5/01; G06F 5/012; H03M 7/24; H03M 7/30; H03M 13/65; H03M 13/6502; H03M 13/6577; H03M 13/658; H03M 13/6588; H03M 13/6594; G06N 3/04; G06N 3/063; G06N 20/00

See application file for complete search history.

(56) References Cited

U.S. PATENT DOCUMENTS

| | | | |
|---|---|---|---|
| 8,401,863 B1* | 3/2013 | Melkote | G10L 19/035 375/240 |
| 2013/0129241 A1* | 5/2013 | Wang | H04N 19/82 382/233 |

(Continued)

OTHER PUBLICATIONS

E. Hall, Computer Image Processing and Recognition, Computer Science and Applied Mathematics, Academic Press, Inc Ltd, 1979, Ch 6 (Year: 1979).*

*Primary Examiner* — Andrew Caldwell
*Assistant Examiner* — Emily E Larocque
(74) *Attorney, Agent, or Firm* — Patterson + Sheridan, LLP

(57) ABSTRACT

Certain aspects of the present disclosure provide a method of encoding data. The method generally includes receiving data comprising a fractional number comprising an exponential component and a fractional component, the exponential component being represented by an exponential bit sequence, the fractional component being represented by a fractional bit sequence. The method further includes determining if the fractional component is within a threshold of 0 or 1. The method further includes setting the fractional component to 0 when the fractional component is within the threshold of 0 or 1. The method further includes downscaling the fractional bit sequence based on a difference between the exponential component and a second threshold. The method further includes encoding the data. The method further includes transmitting the encoded data.

18 Claims, 3 Drawing Sheets

(56) References Cited

U.S. PATENT DOCUMENTS

2017/0006288 A1* 1/2017 Boitard .................. G06T 5/002
2018/0167616 A1* 6/2018 Gish .................... H04N 19/184
2019/0373283 A1* 12/2019 Lindberg ............. H04N 19/124

* cited by examiner

FLOATING-POINT DATA COMPRESSION

TECHNICAL FIELD

Certain aspects of the present disclosure generally relate to compressing data including floating-point numbers and to utilizing such floating-point number compression for graphic processing unit (GPU) or neural processing unit (NPU) processing, such as neural network training.

BACKGROUND

In computing, some processors, such as GPUs and NPUs, use floating-point arithmetic for performing computations. In particular, input data to a processor may be represented using floating-point numbers, and computations are performed on the floating-point numbers.

Different floating-point number formats can be used for floating-point numbers. The different floating-point number formats may utilize different numbers of bits to represent different components of a floating-point number. For example, a floating-point number comprises an exponential component (also referred to as the exponent and represented by an exponential bit sequence) and a fractional component (also referred to as the significand and represented by a fractional bit sequence). In certain aspects, a floating-point number further comprises a sign component (also referred to as the sign).

One example floating-point number format is half-precision floating-point format (also referred to as FP16) where a floating-point number is represented by a string of 16 bits corresponding to a bit sequence. The first bit is a sign bit and represents the sign component. The next 5 bits represent the exponent width and correspond to the exponential component. The remaining 10 bits represent the significand precision and correspond to the fractional component. In certain aspects, the fractional number represented by the FP16 format is calculated using the following equation (1):

$$(-1)^{sign\_bit} \times 2^{exp\_bit-15} \times 1.frac\_bit_2 \quad (1)$$

where,
sign_bit is the value of the sign component;
exp_bit is the value of the exponential component; and
frac_bit is the value of the fractional component.

Another example floating-point number format is single-precision floating-point format (also referred to as FP32) where a floating-point number is represented by a string of 32 bits. The first bit is a sign bit and represents the sign component. The next 8 bits represent the exponent width and correspond to the exponential component. The remaining 23 bits represent the significand precision and correspond to the fractional component. In certain aspects, the fractional number represented by the FP32 format is calculated using the following equation (2):

$$(-1)^{sign\_bit} \times 2^{exp\_bit-127} \times 1.frac\_bit_2 \quad (2)$$

where,
sign_bit is the value of the sign component;
exp_bit is the value of the exponential component; and
frac_bit is the value of the fractional component.

Such floating-point numbers are used in many different applications. For example, in a GPU, intermediate data of an image or video may be represented as floating-point numbers and processing of the image or video may be performed on the floating-point numbers. In another example, in a NPU, floating-point numbers may be used as part of neural network training. In particular, certain machine learning models may be configured to use input data (e.g., activation values, weights of layers of a neural network, etc.) represented using floating-point numbers.

As part of the processing of floating-point numbers in a computing system, such floating-point numbers are stored and retrieved from memory (e.g., internal and/or external) of the computing system. In particular, processor(s) that process the floating-point numbers are coupled to the memory via a bus, and data comprising the floating-point numbers is passed between the processor(s) and memory over the bus. The bus may have a limited bandwidth. Accordingly, the amount of data that can be passed over the bus between the processor and the memory may be limited, which may serve as a bottleneck to the processing of floating-point numbers in the computing system.

For example, in neural network pipeline processing, data comprising floating-point numbers is stored and retrieved from memory by the NPU as needed for processing. For example, the neural network pipeline processing may be divided into sets of operations referred to as layers, where for each layer the NPU processes input data and generates corresponding output data. The output data of one layer can be the input data of a subsequent layer in the neural network pipeline. After each layer generates output data, the output data may be stored in memory, and the subsequent layer may retrieve the data from memory for further processing. Accordingly, such data access may cause high bandwidth usage of the bus, leading to high power consumption and potential latency for storing and retrieving data over the bus.

SUMMARY

Certain aspects of the present disclosure provide a method of encoding data. The method generally includes receiving data comprising a fractional number comprising an exponential component and a fractional component, the exponential component being represented by an exponential bit sequence, the fractional component being represented by a fractional bit sequence. The method further includes determining if the fractional component is within a threshold of 0 or 1. The method further includes setting the fractional component to 0 when the fractional component is within the threshold of 0 or 1. The method further includes downscaling the fractional bit sequence based on a difference between the exponential component and a second threshold. The method further includes encoding the data. The method further includes transmitting the encoded data.

Certain aspects of the present disclosure provide a computer system for encoding data. The computer system includes a memory and a processor coupled to the memory. The processor is configured to receive data comprising a fractional number comprising an exponential component and a fractional component, the exponential component being represented by an exponential bit sequence, the fractional component being represented by a fractional bit sequence. The processor is further configured to determine if the fractional component is within a threshold of 0 or 1. The processor is further configured to set the fractional component to 0 when the fractional component is within the threshold of 0 or 1. The processor is further configured to downscale the fractional bit sequence based on a difference between the exponential component and a second threshold. The processor is further configured to encode the data. The processor is further configured to transmit the encoded data.

Certain aspects of the present disclosure provide a computer system for encoding data. The computer system includes means for receiving data comprising a fractional number comprising an exponential component and a fractional component, the exponential component being represented by an exponential bit sequence, the fractional component being represented by a fractional bit sequence. The computer system further includes means for determining if the fractional component is within a threshold of 0 or 1. The computer system further includes means for setting the fractional component to 0 when the fractional component is within the threshold of 0 or 1. The computer system further includes means for downscaling the fractional bit sequence based on a difference between the exponential component and a second threshold. The computer system further includes means for encoding the data. The computer system further includes means for transmitting the encoded data.

Certain aspects of the present disclosure provide a non-transitory, computer readable medium having instructions stored thereon for encoding data. Execution of the instructions by a computing system causes the computing system to carry out the step of receiving data comprising a fractional number comprising an exponential component and a fractional component, the exponential component being represented by an exponential bit sequence, the fractional component being represented by a fractional bit sequence. Execution of the instructions by the computing system further causes the computing system to carry out the step of determining if the fractional component is within a threshold of 0 or 1. Execution of the instructions by the computing system further causes the computing system to carry out the step of setting the fractional component to 0 when the fractional component is within the threshold of 0 or 1. Execution of the instructions by the computing system further causes the computing system to carry out the step of downscaling the fractional bit sequence based on a difference between the exponential component and a second threshold. Execution of the instructions by the computing system further causes the computing system to carry out the step of encoding the data. Execution of the instructions by the computing system further causes the computing system to carry out the step of transmitting the encoded data.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
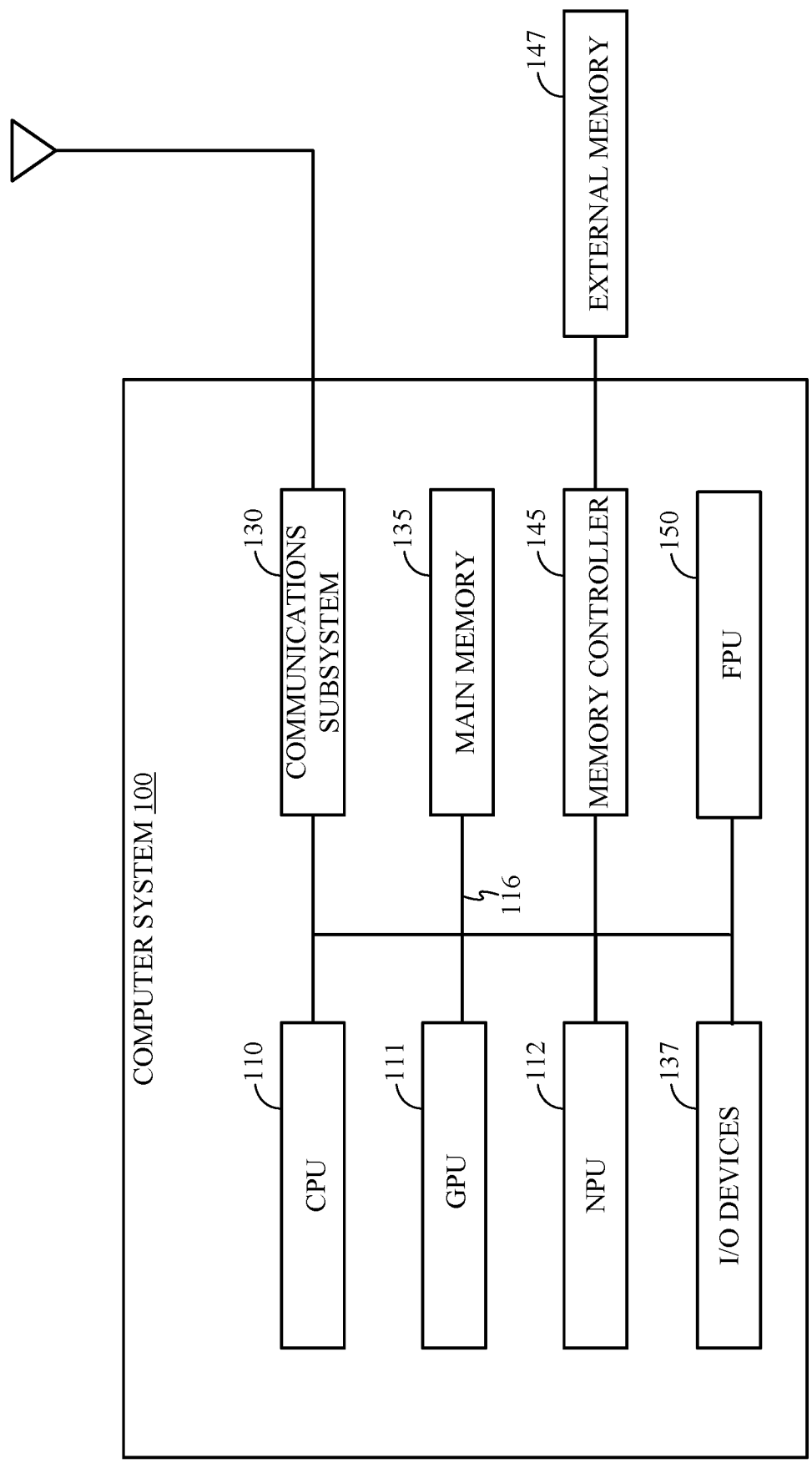
FIG. 1 illustrates an embodiment of a computer system, according to certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As discussed, processing of floating-point numbers in a computing system or a computing device, such as a mobile phone, laptop, desktop, server, mobile device, tablet, etc., can cause high bandwidth usage of a bus between processors(s) of the computing device and memory (e.g., internal and/or external) used by the computing device. Such high bandwidth usage can lead to high power consumption at the computing device, and further latency for processing data due to latency in transferring data over the bus.

In some cases, computing devices can represent data as unsigned integers, which use less bits (e.g., 8 bits) to represent the data than floating-point numbers. By using fewer bits to represent the data, fewer bits are communicated over the bus, thereby reducing bandwidth usage, which may lower power consumption and latency. However, the use of unsigned integers to represent data reduces the quality of the data as a smaller range of numbers can be represented by unsigned integers as compared to floating-point numbers.

Accordingly, certain aspects herein provide for compression of data comprising floating-point numbers by a processor, such as a floating-point unit (FPU) of the computing device. The FPU may be configured to perform floating-point compression and/or decompression as discussed herein. In certain apsects, multiple processing units (e.g., NPU, GPU, CPU, etc.) may share a single FPU of the computing device. In certain aspects, one or more processing units of the computing device may have its own FPU (such as integrated into the processor, integral to the processor, etc.). In certain aspects, one of more of the processing units performs floating-point compression and/or decompression as discussed herein itself. In particular, in certain aspects, the processor compresses the data to reduce a number of bits used to represent the data and stores the compressed data in memory instead of the uncompressed data. Further, when a processor (the same or a different processor) retrieves the data from memory, it is still compressed. Since the compressed data includes a fewer number of bits than the uncompressed data, the amount of bus bandwidth used to store and retrieve the data to/from memory by the processor(s) is reduced, thereby lowering power consumption and latency at the computing device for processing floating-point numbers.

In certain aspects, a lossless compression algorithm is used to compress the data comprising floating-point numbers (e.g., representing video or data), such as prediction methods, variable length coding (VLC), etc. Accordingly, floating-point numbers are still used to represent data, thereby maintaining the quality of the data, while compression reduces bus bandwidth usage.

In certain aspects, however, existing compression algorithms alone (e.g., existing lossless compression algorithms) may not be able to compress the data comprising floating-point numbers significantly, so any reduction in bus bandwidth usage may be minimal. For example, the dynamic range of the floating-point number values may vary significantly, making compression difficult. Accordingly, certain aspects herein provide techniques for pre-processing data comprising floating-point numbers to reduce a dynamic range of the floating-point numbers, such as to reduce a dynamic range of a fractional component of a floating-point number. The pre-processed data may then be compressed. The resulting compressed data may include fewer bits as compared to if the data were compressed without performing the pre-processing. Accordingly, the techniques discussed herein advantageously can reduce bus bandwidth usage in a computing device, thereby lowering power consumption and latency at the computing device for processing floating-point numbers.

Though certain aspects are described with respect to reducing bus bandwidth usage, it should be noted that the techniques discussed herein can provide other advantages and be used for other purposes. For example, the enhanced compression of floating-point numbers as discussed herein can reduce the amount of storage space needed in a computing device (which may have limited storage) to store data. Further, the compressed floating-point numbers may be sent over additional or alternative transmission mediums than a bus as discussed herein, such as over wireless or wired mediums. The communication of the compressed floating-point numbers over other transmission mediums may similarly reduce bandwidth usage of the transmission medium, thereby reducing power and latency for communicating the compressed floating-point numbers over the transmission medium.

Further, though certain aspects are described herein with respect to FP16 and/or FP32 formats, it should be understood that similar techniques as described herein may be used for other floating-point number formats.

FIG. 1 provides a schematic illustration of one embodiment of a computer system 100 that can perform the methods provided by various other embodiments. It should be noted that FIG. 1 is meant only to provide a generalized illustration of various components, any or all of which may be utilized as appropriate. FIG. 1, therefore, broadly illustrates how individual system elements may be implemented in a relatively separated or relatively more integrated manner.

The computer system 100 is shown comprising hardware elements that can be electrically coupled via a bus 116. The hardware elements may include a CPU 110, which can include without limitation one or more general-purpose processors, one or more special-purpose processors, and/or other processing means, which, as stated above, can be utilized to perform various steps, such as one or more of the blocks shown in FIG. 2. The bus 116 may couple two or more of the CPUs 110, or multiple cores of a single CPU or a plurality of CPUs. The hardware elements further may include a GPU 111, which is a special purpose processor for handling graphics processing. The hardware elements further may include a NPU 112, which is a special purpose processor for handling neural processing/machine learning.

The hardware elements further may include a FPU 150 that is shared by the other processing units as discussed. In certain aspects, in addition or alternative to the separate FPU 150, one or more of the processing units may have its own FPU.

Hardware elements may also include one or more input/output devices 137, which can include devices such as a touch pad, keyboard, microphone, sensors, displays, speakers, and/or the like.

The computer system 100 may further include a main memory 135, which can comprise, without limitation, a random access memory ("RAM"), such as a dynamic random-access memory (DRAM), such as, double data rate (DDR) synchronous DRAM (SDRAM). The computer system 100 may further include a memory controller 145 coupled to an external memory 147. The processors, including one or more of CPU 110, GPU 111, and/or NPU 112 are configured to store/retrieve data from memory, including main memory 135 and/or external memory 147 (via memory controller 145) over bus 116.

The computer system 100 might also include a communications subsystem 130, which can include without limitation a modem, a network card (wireless or wired), an infrared communication device, a wireless communication device, and/or a chipset (such as a Bluetooth™ device, an 802.11 device, a WiFi device, a LTE device, a NR device, a 5G device, etc.), and/or the like. The communications subsystem 130 may include one or more input and/or output communication interfaces to permit data to be exchanged with a network, other computer systems, and/or any other electrical devices/peripherals.

The computer system 100 also can comprise software elements, such as located within the main memory 135, including an operating system, device drivers, executable libraries, and/or other code, such as one or more application (s), which may comprise computer programs provided by various embodiments, and/or may be designed to implement methods, and/or configure systems, provided by other embodiments, as described herein. Merely by way of example, a portion of one or more procedures described with respect to the method(s) discussed herein, might be implemented as code and/or instructions executable by a computer (and/or a processing unit within a computer, such as FPU 150, CPU 110, GPU 111, and/or NPU 112); in an aspect, then, such code and/or instructions can be used to configure and/or adapt a general purpose computer (or other device) to perform one or more operations in accordance with the described methods.

A set of these instructions and/or code might be stored on a non-transitory computer-readable storage medium. In some cases, the storage medium might be incorporated within a computer system, such as computer system 100. In other embodiments, the storage medium might be separate from a computer system (e.g., a removable medium, such as an optical disc), and/or provided in an installation package, such that the storage medium can be used to program, configure, and/or adapt a general purpose computer with the instructions/code stored thereon. These instructions might take the form of executable code, which is executable by the computer system 100 (e.g., FPU 150, CPU 110, GPU 111, and/or NPU 112) and/or might take the form of source and/or installable code, which, upon compilation and/or installation on the computer system 100 (e.g., using any of a variety of generally available compilers, installation programs, compression/decompression utilities, etc.), then takes the form of executable code.

It will be apparent to those skilled in the art that substantial variations may be made in accordance with specific requirements.

Figure 2:
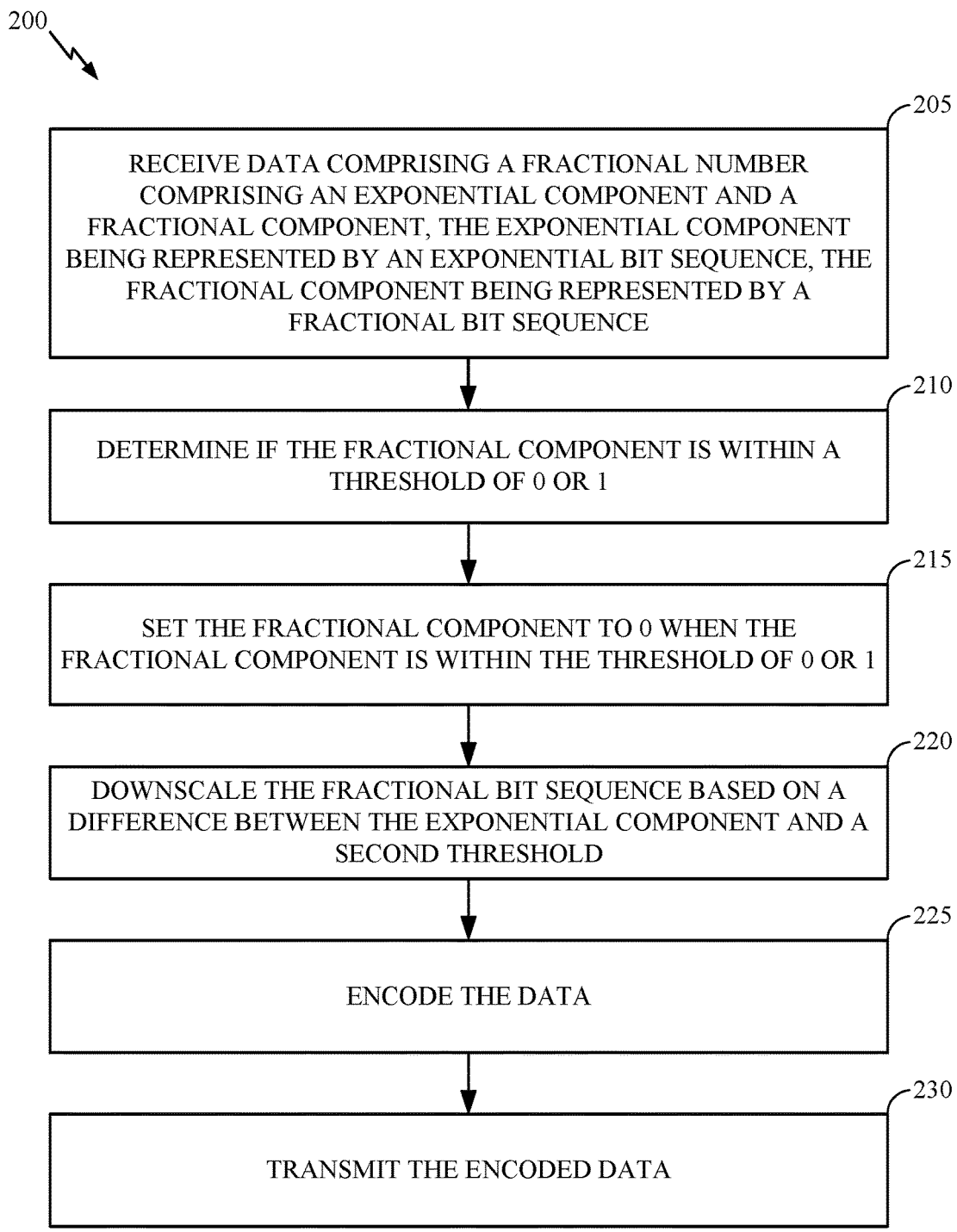
FIG. 2 illustrates example operations for pre-processing data comprising floating-point numbers to reduce a dynamic range of the floating-point numbers and encoding the data, in accordance with certain aspects of the present disclosure.

FIG. 2 illustrates example operations 200 for pre-processing data comprising floating-point numbers to reduce a dynamic range of the floating-point numbers, such as by computer system 100 (e.g., a processor of computer system 100 such as FPU 150, CPU 110, GPU 111, and/or NPU 112), in accordance with certain aspects of the present disclosure.

At block 205, the processor receives data comprising a fractional number comprising an exponential component and a fractional component, the exponential component being represented by an exponential bit sequence, the fractional component being represented by a fractional bit sequence. In certain aspects, the fractional number further comprises a sign component represented by a sign bit indicating a sign of the fractional number. For example, the fractional number may be in a FP16 or FP32 format.

At block 210, the processor determines if the fractional component is within a threshold of 0 or 1. At block 215, the processor sets the fractional component to 0 when the fractional component is within the threshold of 0 or 1. In certain aspects, the processor further increments the exponential component by 1 when the fractional component is within the threshold of 1. In certain aspects, the threshold is programmable, fixed, pre-configured, or the like. Accordingly, in certain aspects, the processor quantizes the data at block 215.

For example, the processor may utilize the following pseudo code to perform the operations indicated by blocks 210 and 215, where the fractional number is represented by equation (1) or (2), and frac th is the threshold:

```
If frac_bit is close to 1 (frac_bit>1023-frac_th), exp_bit += 1 & frac_bit=0
If frac_bit is close to 0 (frac_bit<frac_th), frac_bit=0
```

At block 220, the processor downscales the fractional bit sequence based on a difference between the exponential component and a second threshold. In certain aspects, the second threshold is programmable, fixed, pre-configured, or the like. In certain aspects, downscaling the fractional bit sequence comprises shifting the fractional bit sequence by a number of bits based on the difference between the exponential component and the second threshold. In certain aspects, the processor further determines if the exponential component is greater than a third threshold, wherein downscaling the fractional bit sequence is performed when the exponential component is greater than the third threshold. In certain aspects, the third threshold is programmable, fixed, pre-configured, or the like. In certain aspects, the third threshold equals the second threshold.

For example, the processor may utilize the following pseudo code to perform the operations indicated by block 220, where the fractional number is represented by equation (1) or (2), exp-th2 is the second threshold (e.g., and exp-th2 may equal 15), and exp-th3 is the third threshold (e.g., and exp-th3 may equal 15):

```
If exp_bit > exp_th3,
    Then frac_bit = frac_bit >> (exp_bit−exp_th2)
```

In another example, the processor may utilize the following pseudo code to perform the operations indicated by blocks 210-220, where the fractional number is represented by equation (1) or (2), offset scale is scaling factor (e.g., programmable, fixed, pre-configured, or the like), down is a parameter (e.g., programmable, fixed, pre-configured, or the like, for example 4), and exp th is a threshold (e.g., programmable, fixed, pre-configured, or the like):

```
//Shift and offset derivation
    if (exp_bit)
        shift = clip3(0, 15, exp_th − exp_bit);
        //clip3(min, max, val) = (val>max?max:(val<min?min:val))
    else
        shift = 0;
    offset = shift ? clip3(0, 500, 2 << (shift − 1)) : 0;
    offset = (offset * offset_scale) >> down;
//Quantization
    if (exp_bit && frac_bit > 1023 − offset)
        exp_bit+= 1;
        frac_bit = 0;
//Downscaling
    frac_bit = frac_bit >> shift;
```

At block 225, the processor encodes (e.g., compresses) the data. In certain aspects, the processor uses prediction methods to encode the data, such as to determine a predictor value and calculate a residual. For example, in certain aspects, the data comprises image data comprising a plurality of tiles, a first tile of the plurality of tiles being represented at least in part by the fractional number. Each tile of the image may have dimensions M×N and represent M×N pixels of the image data. Therefore, tiles may be spatially arranged with respect to one another in the image data such as based on the spatial arrangement of pixels of the image data they represent. Further, each tile may be divided into two sub-tiles. Each pixel of a sub-tile may be represented by a fractional component and an exponential component of a floating-point number. The values of the fractional component and exponential component of the floating-point number can correspond to different prediction planes, meaning that the fractional components and exponential components may be encoded separately.

Accordingly, in certain aspects, the processor determines a predictor value for the first tile and calculates a residual for the first tile based on the fractional number (e.g., corresponding to the actual value of a pixel) and the predictor value. In certain aspects, one or more predictor values are generated for a processing unit (e.g., a tile, a sub-tile, etc.) corresponding to one or more pixels, and a residual is calculated for each of the one or more pixels that corresponds to the difference between one of the predictor values and the actual value of the pixel. The actual pixel values of the processing unit can then be represented by the one or more predictor values and the residuals of each of the one or more pixels. In certain aspects, the residual and/or predictor values are stored. In certain aspects, one or more predictor values may be derived by the processor. Where there is more than one predictor value for the processing unit, additional data may be stored for each pixel indicating which predictor value the residual is calculated with respect to.

For example, in certain aspects, the prediction method is a spatial prediction method that uses neighboring data of a pixel to determine a predictor value for the pixel. For example, the predictor value may be based on the value of one or more of a left neighbor pixel (L), upper neighbor pixel (U), or upper-left neighbor pixel (UL) with respect to the pixel. In certain aspects, the predictor value is set as one of L, U, or UL. In certain aspects, the predictor value is set as L+U−UL. In certain aspects, the processor determines the residual as the actual value of the pixel minus the predictor value. Further, in certain aspects, the processor converts the residual data from a signed floating-point number to an un-signed floating-point number.

In certain aspects, the predictor value corresponds to a maximum or minimum value of the plurality of tiles. For example, in certain aspects, the processor determines a minimum pixel value and a maximum pixel value for a processing unit (e.g., tile, sub-tile, etc.). The minimum pixel value is used as one predictor value for the processing unit (e.g., min), and the maximum pixel value is used as another predictor value for the processing unit (e.g., max). For each pixel of the processing unit, if the pixel value minus min is greater than max minus the pixel value, the predictor value used for that pixel is max, otherwise the predictor value used for that pixel is min. If the predictor value for a pixel is max, then the residual is calculated as max minus the actual pixel value. If the predictor value for a pixel is min, then the residual is calculated as the actual pixel value minus min. One benefit of such min and max predictor values with that the residual is always non-negative to a conversion of the residual data from a signed floating-point number to an un-signed floating-point number is not needed, reducing computing cycles needed.

In certain aspects, no prediction is used and the residual is equal to the actual pixel value.

In certain aspects, processing units may use different prediction methods (e.g., for different layers of a neural network), and accordingly bits are used to signal the type of prediction method used for a particular processing unit.

Further, in certain aspects, the processor applies variable length coding to the residuals. For example, in certain aspects, the processor applies run-length encoding with VLC to code the residuals. In certain aspects, the VLC codeword tables used may be either fixed (e.g., predefined VLC tables, such as Truncated-Unary (TU) code, or Exponential-Golomb (EG) code) or adaptive (e.g., updated on the fly, such as based on a number of most significant bits to be compressed).

Further, at block 230, the processor transmits the encoded data (e.g., over a bus, such as bus 116, for storage in a memory, such as memory 135 and/or 147). For example, the processor transmits the predictor value and/or the coded residual.

Operations 200 can thus be used to pre-process data including a floating-point number to reduce the dynamic range of a fractional component of the floating-point number. Operations 200 can further be used to encode or compress the data.

The processor may further be configured to receive the encoded data (e.g., over a bus from memory) and decode and post-process the data to recreate the floating-point numbers that were pre-processed and encoded, such as according to operations 200. It should be noted that the recreated floating-point numbers may not be the same as the original floating-point numbers as the pre-processing/post-processing may be lossy.

In certain aspects, to decode the encoded data, the processor applies the reverse of the applied encoding as known. Further, in certain aspects to post-process the data, the processor applies the reverse of the downscaling of the pre-processing to upscale the floating-point number. For example, in certain aspects, the processor uses the following pseudo code to post-process the decoded data, where the fractional number is represented by equation (1) or (2), and exp_th is the same threshold as used for pre-processing:

```
//Shift and offset derivation
    if (exp_bit)
        shift = clip3(0, 15, exp_th − exp_bit);
    else
        shift = 0;
//Upscaling
    frac_bit = frac_bit << shift;
```

Figure 3:
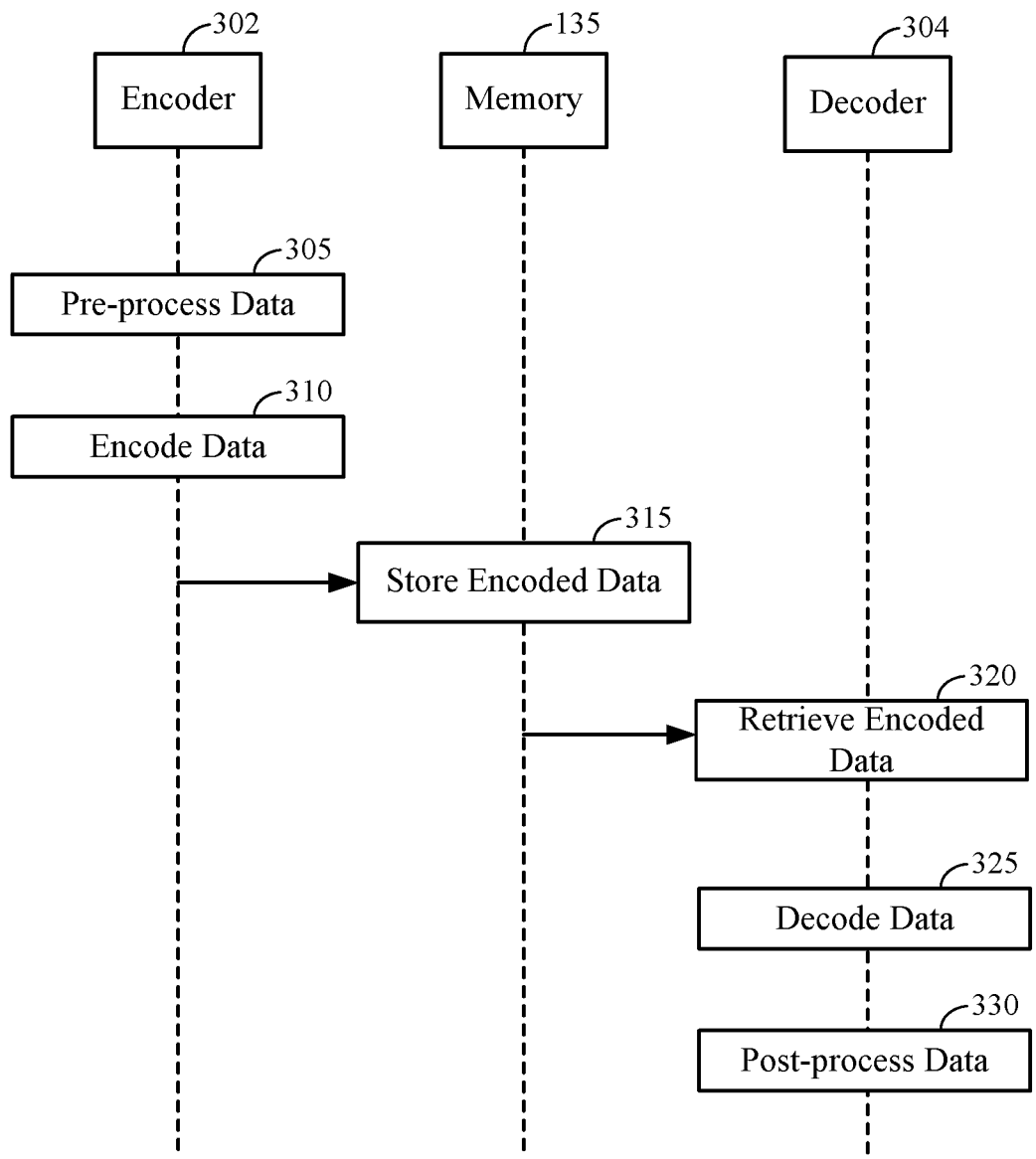
FIG. 3 illustrates an example data flow for pre-processing, encoding, decoding, and post-processing data comprising a floating-point number, according to certain aspects of the present disclosure.

FIG. 3 illustrates an example data flow 300 for pre-processing, encoding, decoding, and post-processing data comprising a floating-point number. Data flow 300 is described with respect to an encoder 302 (e.g., a FPU, NPU, GPU, CPU, etc.), a decoder 304 (e.g., a FPU, NPU, GPU, CPU, etc.), and memory 135 of computer system 100. However, it should be recognized that data flow 300 may be used with other types of processors, other types of memory, etc., as discussed.

As shown, at 305, encoder 302 pre-processes data comprising one or more floating-point numbers. For example, encoder 302 performs operations 210-220 of FIG. 2. Further, at 310, encoder 302 encodes the pre-processed data. For example, encoder 302 performs operations 225 of FIG. 2. Continuing, at 315, the encoder 302 transmits the encoded data to memory 135, which stores the encoded data. For example, encoder 302 performs operations 230 of FIG. 2 and transmits the encoded data over bus 116.

Continuing, at 320, the decoder 304 retrieves the encoded data from memory 135. For example, memory 135 transmits the encoded data over bus 116 to decoder 304 based on a command received from decoder 304. Further, at 325, decoder 304 decodes the data as discussed herein. At 330, decoder 304 post-processes the data as discussed herein.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering. For example, referring to the computer system 100, the FPU 150, CPU 110, GPU 111, and/or NPU 112 may include a receiving component or components to provide the means for receiving, a determining component or components to provide the means for determining, a setting component or components to provide the means for setting, a downscaling component or components to provide the means for downscaling, an encoding component or components to provide the means for encoding, and/or a transmitting component or components to provide the means for transmitting.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method of encoding data, the method comprising:
receiving data comprising a fractional number comprising an exponential component and a fractional component, the exponential component being represented by an exponential bit sequence, the fractional component being represented by a fractional bit sequence, wherein the data comprises image data comprising a plurality of tiles, a first tile of the plurality of tiles being represented at least in part by the fractional number;
determining if the fractional component is within a threshold of 0 or 1;
setting the fractional component to 0 when the fractional component is within the threshold of 0 or 1;
downscaling the fractional bit sequence based on a difference between the exponential component and a second threshold;
encoding the data comprising:
determining a predictor value for the first tile; and
calculating a residual for the first tile based on the fractional number and the predictor value; and
transmitting the encoded data.

2. The method of claim 1, further comprising incrementing the exponential component by 1 when the fractional component is within the threshold of 1.

3. The method of claim 1, wherein the fractional number further comprises a sign component represented by a sign bit indicating a sign of the fractional number.

4. The method of claim 1, wherein downscaling the fractional bit sequence comprises shifting the fractional bit sequence by a number of bits based on the difference between the exponential component and the second threshold.

5. The method of claim 1, further comprising determining if the exponential component is greater than a third threshold, wherein downscaling the fractional bit sequence is performed when the exponential component is greater than the second third threshold.

6. The method of claim 1, wherein the predictor value corresponds to a spatial neighbor of the first tile in the plurality of tiles.

7. The method of claim 1, wherein the predictor value corresponds to a maximum or minimum value of the plurality of tiles.

8. The method of claim 1, wherein encoding the data further comprises applying variable length coding to the residual.

9. A computer system comprising:
a memory; and
a processor coupled to the memory, the processor being configured to:
receive data comprising a fractional number comprising an exponential component and a fractional component, the exponential component being represented by an exponential bit sequence, the fractional component being represented by a fractional bit sequence, wherein the data comprises image data comprising a plurality of tiles, a first tile of the plurality of tiles being represented at least in part by the fractional number;
determine if the fractional component is within a threshold of 0 or 1;
set the fractional component to 0 when the fractional component is within the threshold of 0 or 1;

downscale the fractional bit sequence based on a difference between the exponential component and a second threshold;
encode the data comprising to:
    determine a predictor value for the first tile; and
    calculate a residual for the first tile based on the fractional number and the predictor value; and
    transmit the encoded data.

10. The computer system of claim 9, wherein the processor is further configured to increment the exponential component by 1 when the fractional component is within the threshold of 1.

11. The computer system of claim 9, wherein the fractional number further comprises a sign component represented by a sign bit indicating a sign of the fractional number.

12. The computer system of claim 9, wherein downscaling the fractional bit sequence comprises shifting the fractional bit sequence by a number of bits based on the difference between the exponential component and the second threshold.

13. The computer system of claim 9, wherein the processor is further configured to determine if the exponential component is greater than a third threshold, wherein downscaling the fractional bit sequence is performed when the exponential component is greater than the third threshold.

14. A non-transitory computer readable medium having instructions stored thereon for encoding data, execution of the instructions by a computing system causing the computing system to carry out the steps of:
    receiving data comprising a fractional number comprising an exponential component and a fractional component, the exponential component being represented by an exponential bit sequence, the fractional component being represented by a fractional bit sequence, wherein the data comprises image data comprising a plurality of tiles, a first tile of the plurality of tiles being represented at least in part by the fractional number;
    determining if the fractional component is within a threshold of 0 or 1;
    setting the fractional component to 0 when the fractional component is within the threshold of 0 or 1;
    downscaling the fractional bit sequence based on a difference between the exponential component and a second threshold;
    encoding the data comprising:
        determining a predictor value for the first tile; and
        calculating a residual for the first tile based on the fractional number and the predictor value; and
        transmitting the encoded data.

15. The non-transitory computer readable medium of claim 14, wherein execution of the instructions by the computing system further cause the computing system to carry out the step of incrementing the exponential component by 1 when the fractional component is within the threshold of 1.

16. The non-transitory computer readable medium of claim 14, wherein the fractional number further comprises a sign component represented by a sign bit indicating a sign of the fractional number.

17. The non-transitory computer readable medium of claim 14, wherein downscaling the fractional bit sequence comprises shifting the fractional bit sequence by a number of bits based on the difference between the exponential component and the second threshold.

18. The non-transitory computer readable medium of claim 14, wherein execution of the instructions by the computing system further cause the computing system to carry out the step of determining if the exponential component is greater than a third threshold, wherein downscaling the fractional bit sequence is performed when the exponential component is greater than the third threshold.

* * * * *